(12) United States Patent
Graves

(10) Patent No.: US 10,312,912 B2
(45) Date of Patent: Jun. 4, 2019

(54) GATE CONTROL FOR A TRISTATE OUTPUT BUFFER

(71) Applicant: Texas Instruments Incorporated, Dallas, TX (US)

(72) Inventor: Christopher Michael Graves, Sherman, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 15/635,924

(22) Filed: Jun. 28, 2017

(65) Prior Publication Data

US 2019/0007046 A1 Jan. 3, 2019

(51) Int. Cl.
*H03K 19/0185* (2006.01)
*H03K 19/00* (2006.01)
*H03K 17/16* (2006.01)

(52) U.S. Cl.
CPC ... *H03K 19/018521* (2013.01); *H03K 17/161* (2013.01); *H03K 19/0002* (2013.01)

(58) Field of Classification Search
CPC ............. H03K 17/161; H03K 19/0002; H03K 19/0175; H03K 19/017509; H03K 19/0185; H03K 19/018507; H03K 19/018521
USPC .......... 326/80, 81, 82, 83, 87; 327/108, 109, 327/333
See application file for complete search history.

(56) References Cited

U.S. PATENT DOCUMENTS

| 5,422,523 | A | 6/1995 | Roberts et al. |
| 5,862,390 | A | 1/1999 | Ranjan |
| 5,973,547 | A * | 10/1999 | Ang ........................ H02M 3/07 327/538 |
| 7,514,968 | B1 * | 4/2009 | Lai ................. H03K 19/018528 326/83 |
| 9,680,472 | B2 | 6/2017 | Trivedi et al. |
| 2011/0303988 | A1 | 12/2011 | Dono et al. |

FOREIGN PATENT DOCUMENTS

| EP | 2811653 B1 | 3/2017 |
| WO | 2017044249 A1 | 3/2017 |

OTHER PUBLICATIONS

PCT Search Report for Application No. PCT/US 2018/040045, dated Nov. 29, 2018.

* cited by examiner

*Primary Examiner* — William Hernandez
(74) *Attorney, Agent, or Firm* — Lawrence J. Bassuk; Charles A. Brill; Frank D. Cimino

(57) ABSTRACT

A gate control circuit for a tristate output buffer operating in a first voltage domain includes a pull-up circuit coupled between an upper rail and a first gate control signal, a pull-down circuit coupled between a lower rail and a second gate control signal, and a gate isolation switch coupled between the first gate control signal and the second gate control signal. The gate isolation switch includes a first PMOS transistor coupled in parallel with a first NMOS transistor. The first NMOS transistor is controlled by a first enable signal and the first PMOS transistor is controlled by a second enable signal.

6 Claims, 10 Drawing Sheets

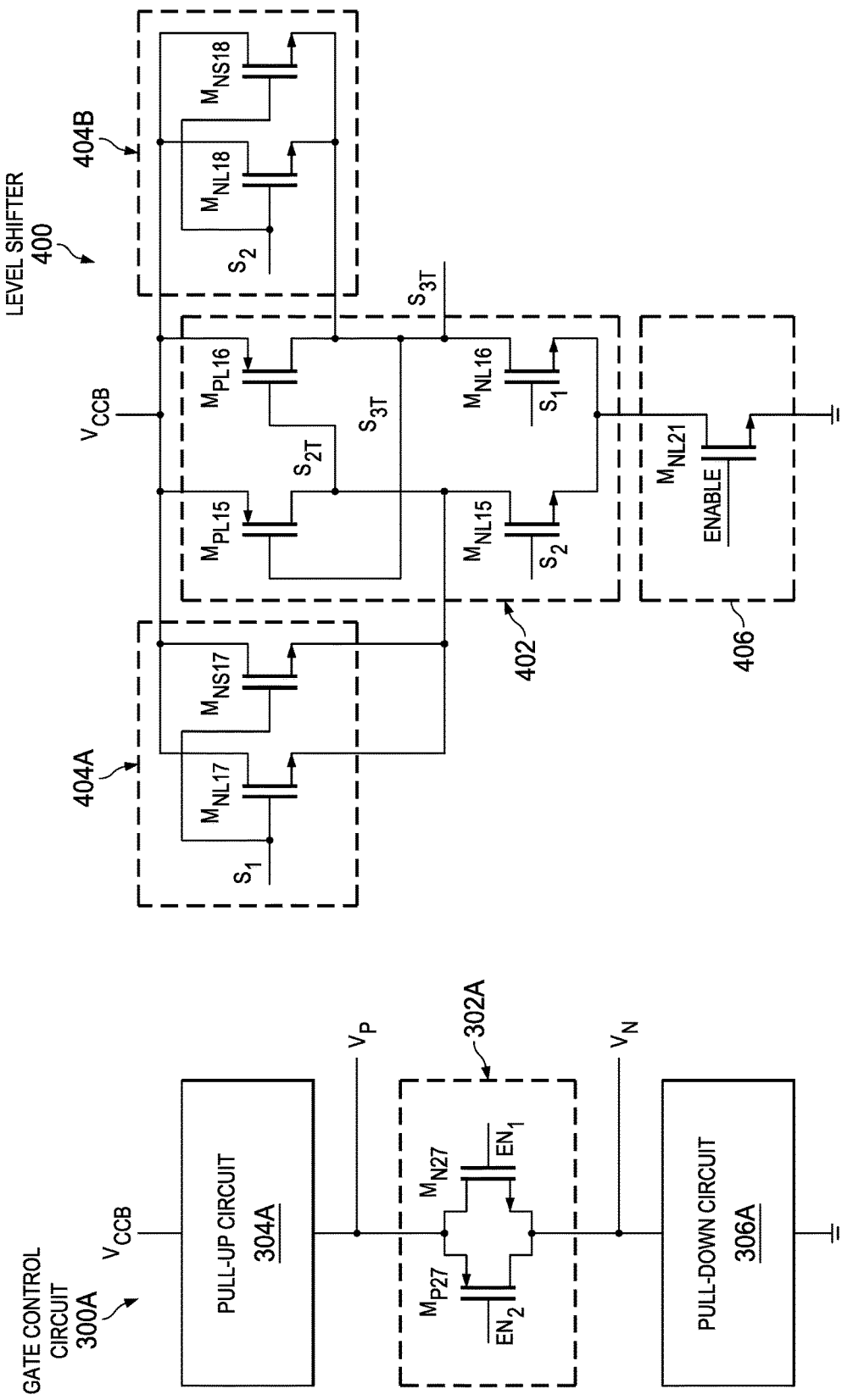

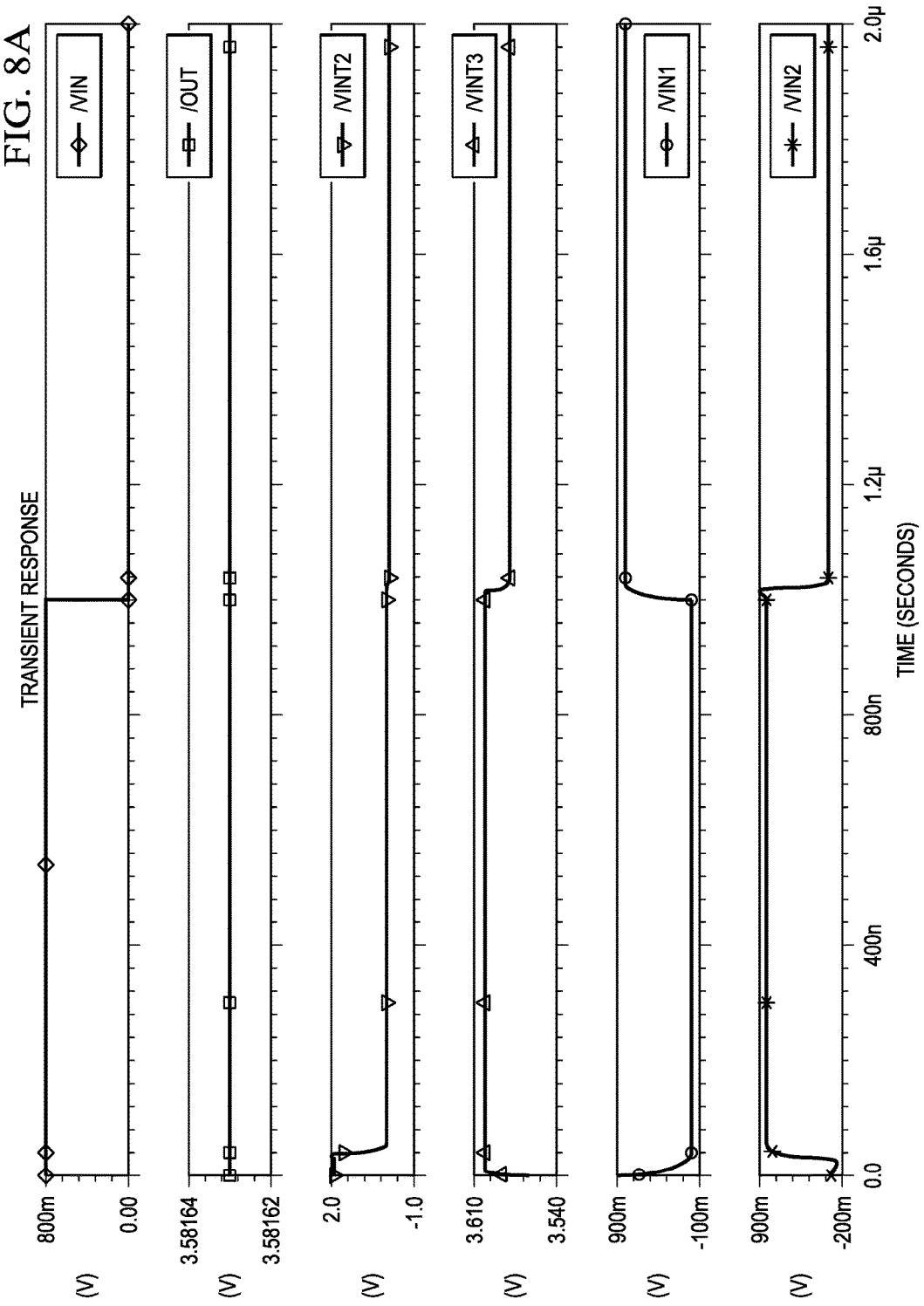

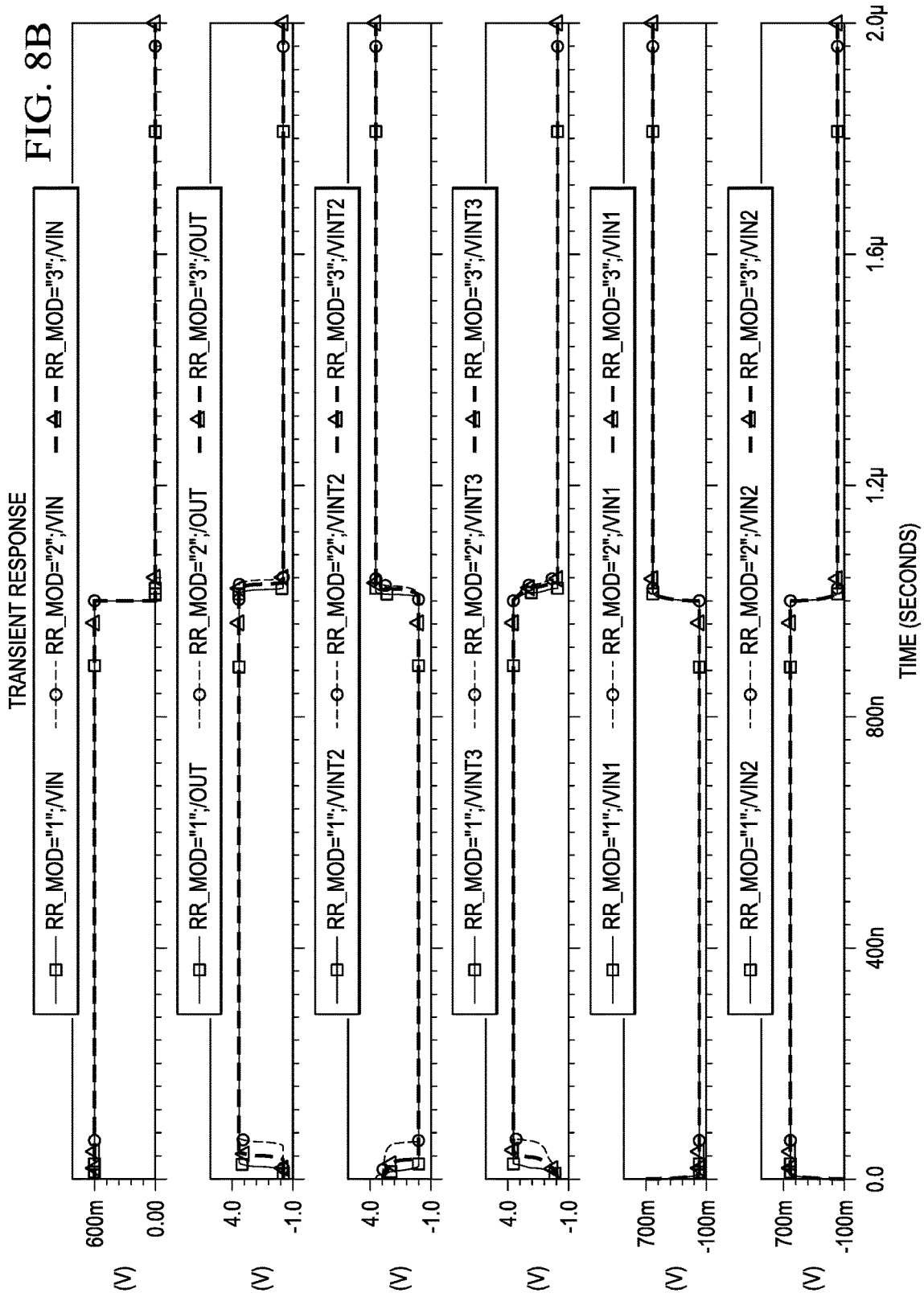

GATE CONTROL FOR A TRISTATE OUTPUT BUFFER

FIELD OF THE DISCLOSURE

Disclosed embodiments relate generally to the field of gate control circuits. More particularly, and not by way of any limitation, the present disclosure is directed to a gate control circuit for a tristate output buffer.

BACKGROUND

As the supply voltage continues to drop for advanced microcontrollers, there is a need to develop low voltage circuits, such as translator products, that will allow these devices to reliably interface with legacy systems. These low voltage translators, in turn, must be capable of supporting a wide voltage range for maximum application flexibility. Existing products support a voltage range from 0.8 V to 3.6 V. However, even lower operating voltages are planned for the future.

SUMMARY

Disclosed embodiments provide a gate control circuit having a gate isolation switch that allows pull-up transistors and pull-down transistors to be shared by the control signals $V_P$ and $V_N$, but also allows the pathway between control signals $V_P$ and $V_N$ to be closed when the gate control circuit is not in use. The gate isolation switch can provide one or more of the following advantages: keep the output in a high impedance state during power-up, simplify the gate control circuit, minimize the overall die area and minimize the static leakage from the gate control circuit.

In one aspect, an embodiment of a gate control circuit for a tristate output buffer operating in a first voltage domain is disclosed. The gate control circuit includes a pull-up circuit coupled between an upper rail and a first gate control signal; a pull-down circuit coupled between a lower rail and a second gate control signal; and a gate isolation switch coupled between the first gate control signal and the second gate control signal, the gate isolation switch comprising a first PMOS transistor coupled in parallel with a first NMOS transistor, the first NMOS transistor being controlled by a first enable signal and the first PMOS transistor being controlled by a second enable signal.

In one aspect, an embodiment of a voltage translator coupled to translate an input signal received in a first voltage domain to an output signal provided in a second voltage domain, wherein each of the first and second voltage domains can span a wide range of low voltages is disclosed. The voltage translator includes an input buffer coupled to receive the input signal and to provide a first input control signal and a second input control signal, the input buffer operating in the first voltage domain; a level shifter coupled to receive the first and second input control signals and to provide an output control signal; a gate control circuit coupled to receive the first and second input control signals and the output control signal and to provide a first gate control signal and a second gate control signal; and an output buffer coupled to receive the first gate control signal and the second gate control signal and to provide the output signal, wherein the level shifter, the gate control circuit and the output buffer each operate in the second voltage domain, the gate control circuit comprising: a pull-up circuit coupled between an upper rail and a first gate control signal; a pull-down circuit coupled between a lower rail (ground) and a second gate control signal; and a gate isolation switch coupled between the first gate control signal and the second gate control signal, the gate isolation switch comprising a first PMOS transistor and a second PMOS transistor coupled in parallel with a first NMOS transistor and a second NMOS transistor, the first and second NMOS transistors being controlled by a first enable signal and the first and second PMOS transistor being controlled by a second enable signal, the first PMOS transistor and the first NMOS transistor having a first threshold voltage, the second PMOS transistor and the second NMOS transistor having a second threshold voltage that is lower than the first threshold voltage.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 3A depicts an implementation of a gate control circuit according to an embodiment of the disclosure;

FIG. 4 depicts an implementation of a level shifter according to an embodiment of the disclosure;

FIG. 8A depicts a set of signals when the voltage translator of FIG. 7 is operated with standard $V_T$ transistors and an input signal operating at 0.8 V is to be translated to an output signal operating at 3.6 V;

FIG. 8B depicts a set of signals when the voltage translator of FIG. 7 is operated with low $V_T$ transistors and an input signal operating at 0.6 V is to be translated to an output signal operating at 3.6 V;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 7:
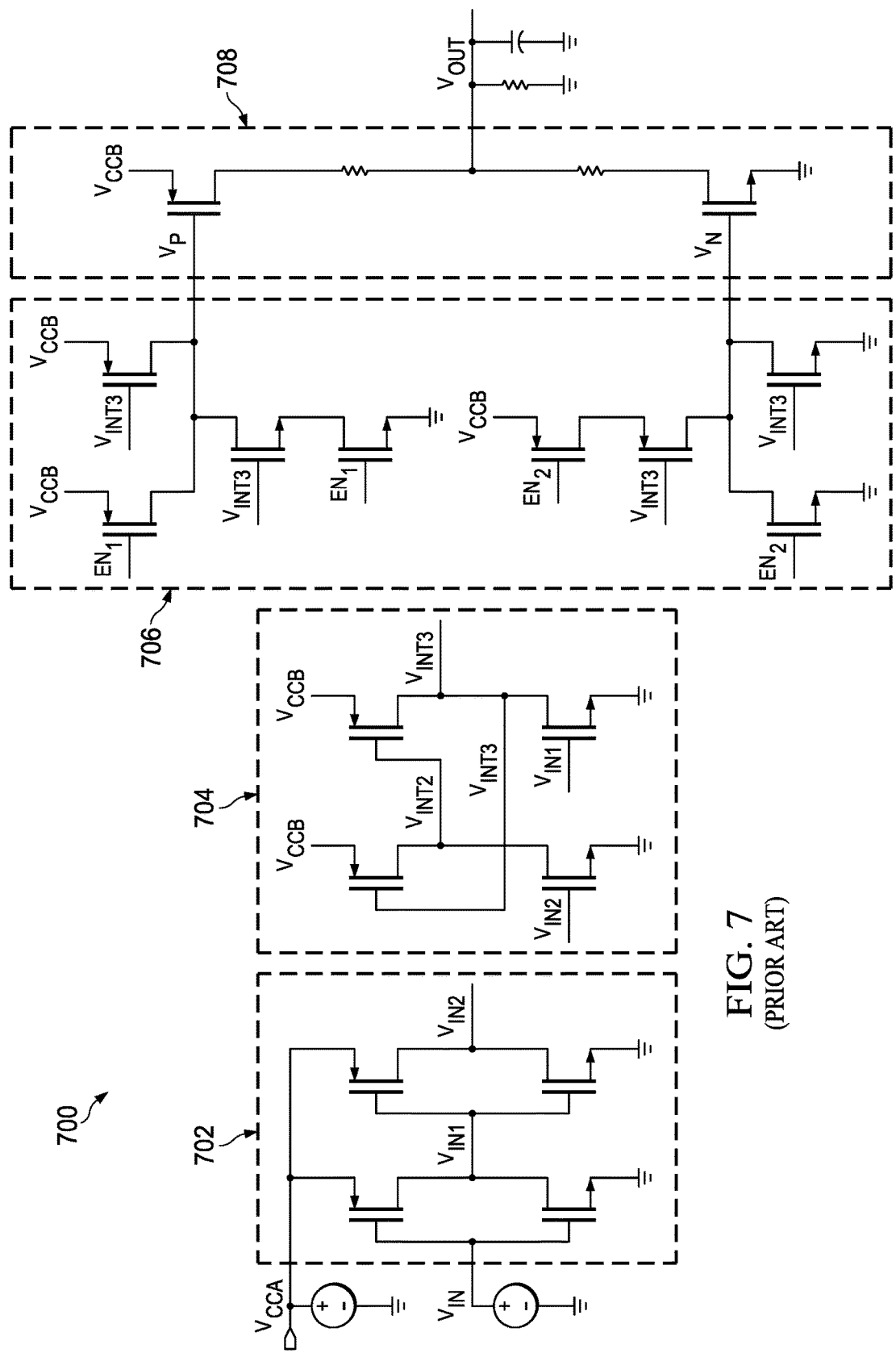
FIG. 7 depicts a schematic of a voltage translator according to the prior art.

The disclosed embodiments evolved from a need to extend the lower voltage range of an existing voltage translator while maintaining support for the existing voltage range of the current device. FIG. 7 is a diagram of a voltage translator 700 according to the prior art. Voltage translator 700 receives a signal $V_{IN}$, which is operable in a first voltage domain, and translates signal $V_{IN}$ to an output signal $V_{OUT}$, which is operable in a second voltage domain. For the purposes of this application, the first voltage domain has an upper rail designated by $V_{CCA}$ and the second voltage domain has an upper rail designated by $V_{CCB}$. In the figures, the lower rail for both the first and second voltage domains is shown as ground; it will be understood that having each of the lower rails equal to ground is not a requirement.

Voltage translator 700 contains four main elements: input buffer 702, level shifter 704, a pre-driver 706, which in the figure shown is a NAND-NOR pre-driver, and output buffer 708. Input buffer 702 operates within the first voltage domain, which utilizes upper rail $V_{CCA}$. Level shifter 704 operates in the second voltage domain, which utilizes $V_{CCB}$, but receives control signals $V_{IN1}$, $V_{IN2}$, which are generated in the first voltage domain. Pre-driver circuit 706 and output buffer 708 each operate in the second voltage domain. Voltage translator 700 supports a voltage range of 1.1-3.6 V and allows each upper rail $V_{CCA}$, $V_{CCB}$ to assume any allowed value within this range. In at least one embodiment, voltage translator 700 is bi-directional, i.e., while the circuits shown translate signals from the voltage domain that utilizes $V_{CCA}$ to the voltage domain that utilizes $V_{CCB}$, a second copy of this circuit operates to translate signals from the voltage domain that utilizes $V_{CCB}$ to the voltage domain that utilizes $V_{CCA}$. One or more pins on the circuit allow the selection of the desired direction of operation. Because of this bi-directionality, both of the output ports must be able to be placed into a high-impedance mode. In order to support lower voltages, both those currently in use and those planned for the future, changes to the circuit of voltage translator 700 are necessary to support a desired voltage range of 0.65-3.6 V. Individual elements of modules 702-708 are not described at this time, but will be discussed in detail in conjunction with the modifications made to each module.

Parallel $V_T$ Architecture:

A major problem that arises from the support of a wide voltage range is finding complementary metal oxide silicon (CMOS) devices that allow for optimal circuit design architectures. For example, a chip according to the embodiment of FIG. 7 was implemented using standard $V_T$ transistors having threshold voltages equal to about 700 mV and operated at voltages that range from 1.1 V to 3.6 V. A test of this chip operating at 0.8 V is shown in FIG. 8A, which depicts the signals $V_{IN}$, $V_{OUT}$, $V_{INT2}$, $V_{INT3}$, $V_{IN1}$ and $V_{IN2}$. The input buffer is switching from 0 V to 0.8 V, but signals $V_{INT2}$, $V_{INT3}$, produced in the level shifter, do not switch properly. This lack of switching in the level shifter is due to the fact that the $V_T$ of the standard $V_T$ transistors is very close to the upper voltage rail, so that the transistors did not have the headroom to properly turn on. As a result, output signal $V_{OUT}$ is not being pulled either high or low.

The circuit of FIG. 7 was then simulated using low $V_T$ transistors having a threshold voltage of about 300 mV throughout the circuit. FIG. 8B again depicts the signals $V_{IN}$, $V_{OUT}$, $V_{INT2}$, $V_{INT3}$, $V_{IN1}$ and $V_{IN2}$. In this simulation, $V_{OUT}$ operated properly and provided a good response to the changes in signal level of $V_{IN}$. However, other problems arise from the use of low $V_T$ transistors, as low $V_T$ transistors have greater leakage problems. This issue can be exacerbated when there is also a need to support a wide range of voltages, as in the present application.

Table 1 and Table 2 below depict two implementations of the circuit of voltage translator 700 with low voltage transistors having two different widths. Table 1 depicts the PMOS, low threshold voltage (PCH_LVT) transistors, which are trying to pull the output voltage $V_{OUT}$ high. VOH is the output voltage high level and IOH is the output drive requirement. $V_{CC}$ designates the voltage domain of the output voltage and Spec indicates that the output voltage must remain above the specified value on a "HIGH" value in order for the output to fall with specifications. Actual voltage values achieved during testing are provided for the PCH_LVT transistors, first with transistors having a width of 650 microns and second with transistors having a width of 1200 microns. Three values are given for each transistor width and indicate process and temperature: N/27 C indicates nominal models at 27 degrees C.; W/40 C indicates weak models at 40 degrees C. and W/125 C indicates weak models at 125 C. The PMOS transistors having a width of 650 microns were sized initially to allow the circuit to operate at 0.8 V. However, at this width, the circuit was not able to support operation in the other voltage domains; the entries highlighted in bold below each fell below the value allowed by the specifications.

Similarly, Table 2 depicts the N-channel, low threshold voltage (NCH_LVT) transistors, which are trying to pull the output voltage $V_{OUT}$ low. Here, Spec indicates that the output voltage must remain below the specified value on a "LOW" value in order for the output to fall with specifications. The NMOS transistors are also shown with two widths: 200 microns and 400 microns. The NMOS transistors having a width of 200 microns were also sized initially to allow the circuit to operate at 0.8 V. Again the circuit was not able to support operation in the other voltage domains, as exemplified by the entries highlighted in bold, which fall below the value allowed by the specifications.

TABLE 1

| VOH | | | PCH_LVT = 650 | | | PCH_LVT = 1200 | | |
| --- | --- | --- | --- | --- | --- | --- | --- | --- |
| VCC (V) | IOH (mA) | Spec (V) | N/ 27 C. | W/ −40 C. | W/ 125 C. | N/ 27 C. | W/- −40 C. | W/ 125 C. |
| 0.8 | 1 | 0.6 | 0.684 | 0.664 | 0.607 | 0.74 | 0.732 | 0.705 |
| 1.1 | 3 | 0.85 | 0.84 | 0.833 | 0.642 | 0.969 | 0.969 | 0.89 |

TABLE 1-continued

| VOH | | | PCH_LVT = 650 | | | PCH_LVT = 1200 | | |
|---|---|---|---|---|---|---|---|---|
| VCC (V) | IOH (mA) | Spec (V) | N/ 27 C. | W/ −40 C. | W/ 125 C. | N/ 27 C. | W/- −40 C. | W/ 125 C. |
| 1.4 | 6 | 1.05 | 0.967 | 0.982 | 0.58 | 1.186 | 1.196 | 1.055 |
| 1.65 | 8 | 1.2 | 1.15 | 1.182 | 0.75 | 1.4 | 1.417 | 1.253 |
| 2.3 | 9 | 1.75 | 1.881 | 1.917 | 1.648 | 2.081 | 2.099 | 1.97 |
| 3 | 12 | 2.3 | 2.521 | 2.561 | 2.29 | 2.748 | 2.768 | 2.633 |

TABLE 2

| VOL | | | NCH_LVT = 200 | | | NCH_LVT = 400 | | |
|---|---|---|---|---|---|---|---|---|
| VCC (V) | IOL (mA) | Spec (mV) | N/ 27 C. | W/ −40 C. | W/ 125 C. | N/ 27 C. | W/- −40 C. | W/ 125 C. |
| 0.8 | 1 | 200 | 107 | 103 | 189 | 52 | 49 | 88 |
| 1.1 | 3 | 250 | 250 | 228 | 454 | 119 | 108 | 201 |
| 1.4 | 6 | 350 | 433 | 387 | 806 | 203 | 183 | 341 |
| 1.65 | 8 | 450 | 522 | 466 | 939 | 246 | 223 | 407 |
| 2.3 | 9 | 550 | 484 | 438 | 787 | 235 | 214 | 373 |
| 3 | 12 | 700 | 592 | 540 | 932 | 289 | 265 | 448 |

The widths of both the NMOS transistors and the PMOS transistors were then increased until operation in all of the allowed voltage domains fell within the specifications, as demonstrated by the voltage values shown. The smallest widths at which operation across the entire voltage range could be reached was 1200 microns for the PMOS transistors and 400 microns for the NMOS transistors. Although the voltage specifications could be met with these values, all of the transistors were oversized in order to meet the wide range of voltages. Such oversized transistors not only take up a large amount of real estate on a chip, but also produce output leakage that is far too high to be either desirable or competitive. Therefore, simply replacing all of the transistors in voltage translator 700 with low $V_T$ transistors was not a viable solution.

Figure 9:
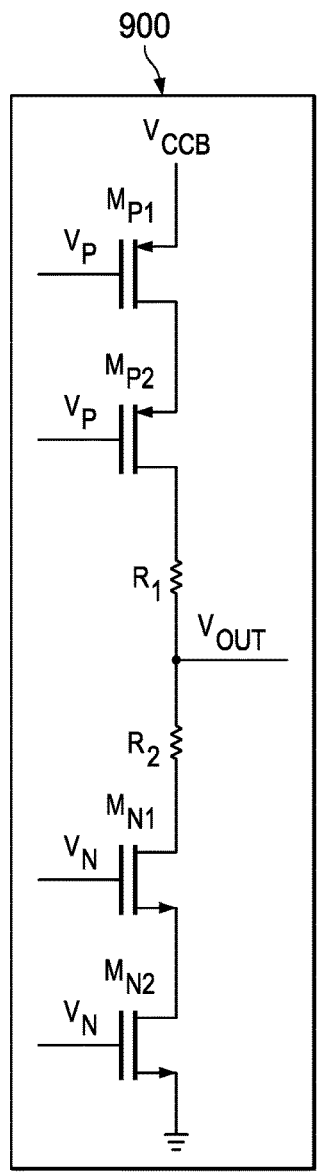
FIG. 9 depicts an output buffer that could be utilized to handle the wide voltage supply range.

Another possible solution to extend the voltage range is to stack several low $V_T$ transistors in series in the output buffer. The problem in the circuit arises from the fact that while low $V_T$ transistors are required by this circuit, the low $V_T$ transistors must still be able to handle 3.6 V. Stacking the low $V_T$ transistors allows each of these transistors to have a lower breakdown voltage ($V_{DS}$), since neither transistor is exposed to the entire voltage range. Subjecting the transistors to lower voltages allows for the use of smaller transistors, which in turn have less leakage. Using this configuration, FIG. 9 depicts output buffer 900, which includes two PMOS transistors $M_{P1}$ and $M_{P2}$ stacked in series between upper rail $V_{CCB}$ and the output node $V_{OUT}$, with resistor $R_5$ coupled in series between transistors $M_{P1}$, $M_{P2}$ and output node $V_{OUT}$. Two NMOS transistors $M_{N1}$ and $M_{N2}$ are stacked in series between the lower rail and the output node $V_{OUT}$, with resistor $R_6$ coupled in series between transistors $M_{N1}$, $M_{N2}$ and output node $V_{OUT}$. The two PMOS transistors $M_{P1}$, $M_{P2}$ are each controlled by gate control signal $V_P$ and the two NMOS transistors $M_{N1}$, $M_{N2}$ are each controlled by gate control signal $V_N$. Gate control signals $V_P$ and $V_N$ are both provided by the gate drive control circuit. Applicant has determined that while the configuration of output buffer 900 is operable, this configuration would require a more complex circuit design for the gate drive control circuit and would also add more risk to high voltage and high temperature reliability.

In the discussion that follows, it will be noted that the transistors are numbered according to the following notation. For a transistor $M_{XYZ}$, X has a value of either N or P and indicates whether the transistor is NMOS or PMOS; Y has a value of either S or L and indicates whether the transistors has a standard threshold voltage or a low threshold voltage; and Z has a numerical value that distinguishes the transistor from similar transistors. The disclosed embodiments were formed using proprietary processes that set a standard $V_T$ at 700 mV and a low threshold voltage at 300 mV. However, the disclosed embodiments are not limited by this proprietary process and other values of standard and low threshold voltages can also be utilized.

Figure 1:
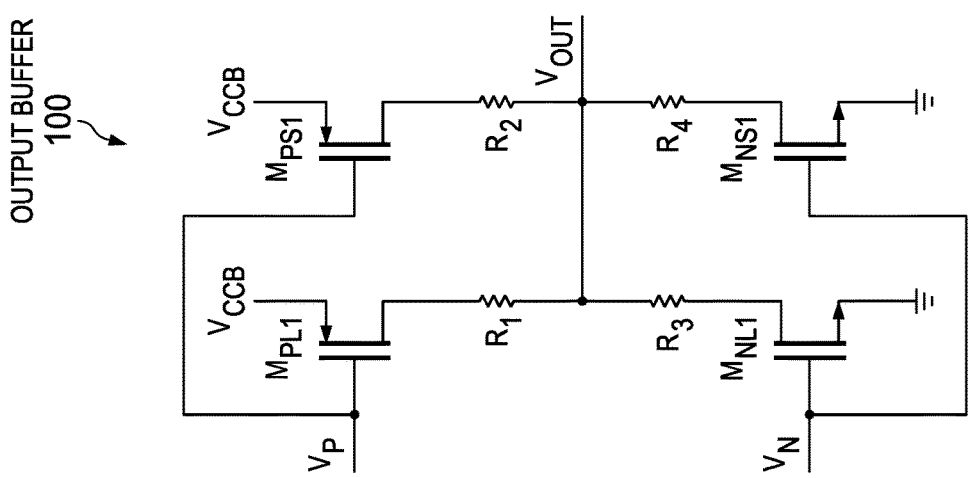
FIG. 1 depicts an example of an output buffer according to an embodiment of the disclosure.

FIG. 1 depicts an example of an output buffer for a voltage translator according to an embodiment of the disclosure. Output buffer 100 operates in the second voltage domain, which in the embodiment shown utilizes upper rail $V_{CCB}$. PMOS transistors, $M_{PL1}$ and $M_{PS1}$ are coupled in parallel with each other between the upper rail $V_{CCB}$ and a signal line that provides $V_{OUT}$. NMOS transistors, $M_{NL1}$ and $M_{NS1}$ are coupled in parallel with each other between the lower rail and the signal line that provides $V_{OUT}$. PMOS transistor $M_{PL1}$ and NMOS transistor $M_{NL1}$ are each low $V_T$ transistors and are sized to handle voltages under 1 V, while PMOS transistor $M_{PS1}$ and NMOS transistor $M_{NS1}$ are each standard $V_T$ transistors and are sized to handle voltage equal to or greater than 1 V. This differential sizing between standard $V_T$ transistors and low $V_T$ transistors generally extends across the present disclosure. However, it will be understood that sizing for other voltage ranges can be utilized with the inventive concepts. Each of PMOS transistors, $M_{PL1}$, $M_{PS1}$ are controlled by gate control signal $V_P$ and each of NMOS transistors, $M_{NL1}$, $M_{NS1}$ are controlled by gate control signal $V_N$; both of the control signals are received from the pre-driver circuit. Additionally, resistor $R_1$ is coupled between PMOS transistor $M_{PL1}$ and output signal $V_{OUT}$; resistor $R_2$ is coupled between transistor $M_{PS1}$ and output signal $V_{OUT}$; resistor $R_3$ is coupled between transistor $M_{NL1}$ and output signal $V_{OUT}$; and resistor $R_4$ is coupled between transistor $M_{NS1}$ and output signal $V_{OUT}$.

As will be seen in the later discussion of the pre-driver circuit, gate control signals $V_P$ and $V_N$ can never be ON at the same time. In operation, when gate control signal $V_P$ is low, PMOS transistors $M_{PL1}$ and $M_{PS1}$ are turned ON and operate together to pull output voltage $V_{OUT}$ high. When gate control signal $V_P$ is high, PMOS transistors $M_{PL1}$ and $M_{PS1}$ are OFF and allow output voltage $V_{OUT}$ to be pulled low. As gate control signal $V_P$ drops, low $V_T$ PMOS transistor $M_{PL1}$ will turn ON first and provide a quick response. Standard $V_T$ PMOS transistor $M_{PS1}$ turns ON only when gate control signal $V_P$ is greater than 1 V, but can handle the larger currents necessary at the higher voltages. Similarly, when gate control signal $V_N$ is high, NMOS transistors $M_{NL1}$ and $M_{NS1}$ turn ON and operate together to pull output voltage $V_{OUT}$ low. Low $V_T$ transistor $M_{NL1}$ will turn ON first and provide a quick response. Standard $V_T$ transistor $M_{NS1}$ turns ON only when the input voltages are greater than or equal to 1 V, but can handle the larger currents necessary at the higher voltages.

Tables 3 and 4 below provide similar information to that given in Tables 1 and 2, but show the operational voltages for an embodiment in which gates of low $V_T$ PMOS transistors have widths of 400 microns and lengths of 0.4 microns; standard $V_T$ transistors have gate widths of 800 microns. The gates of the low $V_T$ NMOS transistors are 150 microns wide and 1.7 microns long, while the gates of the standard $V_T$ NMOS transistors are 200 microns wide. It can be seen in these tables that all levels of operation are within specification.

TABLE 3

| VOH | | | PCH_LVT = 400, PCH = 800 | | |
|---|---|---|---|---|---|
| VCC (V) | IOH (mA) | Spec (V) | N/ 27 C. | W/ −40 C. | W/ 125 C. |
| 0.8 | 1 | 0.6 | 0.748 | 0.621 | 0.721 |
| 1.1 | 3 | 0.85 | 1.028 | 1.011 | 0.991 |
| 1.4 | 6 | 1.05 | 1.297 | 1.289 | 1.243 |
| 1.65 | 8 | 1.2 | 1.534 | 1.529 | 1.476 |
| 2.3 | 9 | 1.75 | 2.2 | 2.197 | 2.153 |
| 3 | 12 | 2.3 | 2.883 | 2.878 | 2.832 |

TABLE 4

| VOL | | | NCH_LVT = 150, NCH = 200 | | |
|---|---|---|---|---|---|
| VCC (V) | IOL (mA) | Spec (mV) | N/ 27 C. | W/ −40 C. | W/ 125 C. |
| 0.8 | 1 | 200 | 70 | 133 | 169 |
| 1.1 | 3 | 250 | 97 | 114 | 183 |
| 1.4 | 6 | 350 | 145 | 143 | 250 |
| 1.65 | 8 | 450 | 168 | 160 | 278 |
| 2.3 | 9 | 550 | 154 | 145 | 237 |
| 3 | 12 | 700 | 186 | 178 | 277 |

Figure 2:
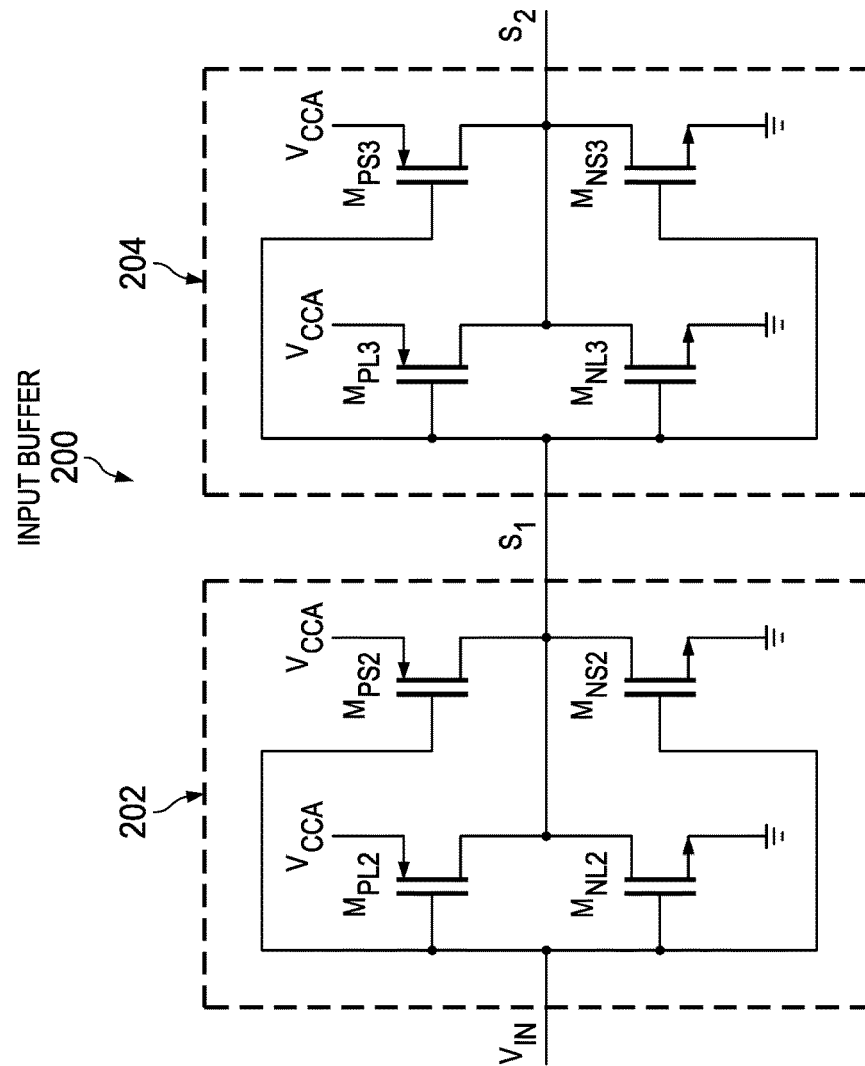
FIG. 2 depicts an implementation of an input buffer according to an embodiment of the disclosure.

The use of a parallel $V_T$ architecture in applications that can receive a wide range of voltages is not limited to the example shown in FIG. 1. FIG. 2 depicts an input buffer 200 for the same voltage translator according to an embodiment of the disclosure. Input buffer 200 operates in the first voltage domain and includes two inverters 202, 204, which receive an input signal $V_{IN}$ and provide input control signals $S_1$ and $S_2$.

Inverter 202 includes PMOS low $V_T$ transistor $M_{PL2}$ coupled in series with NMOS low $V_T$ transistor $M_{NL2}$ between the upper rail $V_{CCA}$ and the lower rail. PMOS standard $V_T$ transistor $M_{PS2}$ is coupled in series with NMOS standard $V_T$ transistor $M_{NS2}$ between the upper rail and the lower rail. Each of transistors $M_{PL2}$, $M_{PS2}$, $M_{NL2}$, and $M_{NS2}$, are coupled to receive input signal $V_{IN}$ on a respective gate. The midpoint between low $V_T$ transistors $M_{PL2}$ and $M_{NL2}$ is coupled to the midpoint between standard $V_T$ transistors $M_{PS2}$ and $M_{NS2}$ to provide input control signal $S_1$.

Inverter 204 includes PMOS low $V_T$ transistor $M_{PL3}$ coupled in series with NMOS low $V_T$ transistor $M_{NL3}$ between the upper rail and the lower rail. PMOS standard $V_T$ transistor $M_{PS3}$ is coupled in series with NMOS standard $V_T$ transistor $M_{NS3}$ between the upper rail and the lower rail. Each of transistors $M_{PL3}$, $M_{PS3}$, $M_{NL3}$ and $M_{NS3}$ are coupled to receive input control signal $S_1$ on a respective gate. The midpoint between low $V_T$ transistors $M_{PL3}$ and $M_{NL3}$ is coupled to the midpoint between standard $V_T$ transistors $M_{PS3}$ and $M_{NS3}$ to provide input control signal $S_2$.

Using the disclosed combination of low $V_T$ transistors coupled in parallel with standard $V_T$ transistors allows input buffer 200 and output buffer 100 to operate effectively across the entire range of voltages of 0.65 V to 3.6 V. The low $V_T$ devices are sized for drive strength (i.e., current) requirements below 1 V operation while the standard $V_T$ components are sized for the higher voltage drive strength requirements. The combination of low $V_T$ transistors and standard $V_T$ transistors coupled in parallel minimizes the static leakage current while still supporting the full range of device operation. As will be seen in the discussion of the level shifter and pre-driver circuits, many of the transistors in these modules can be implemented with the disclosed low $V_T$ and standard $V_T$ transistors coupled in parallel to allow operation across the larger range of voltages while optimizing the operation across the extended range.

The disclosed configuration is advantageous in that this configuration allows a designer to have another degree of freedom in the circuit architecture, depending on the product requirements across the full operating voltage range. The transistor widths and lengths for both low $V_T$ and standard $V_T$ components can be selected separately and PMOS devices and NMOS devices can each be optimized. Circuits that work over a wider voltage range than existing devices are now possible.

Output Driver Gate Control Circuit

When designing an output buffer, it is critical to optimize the gate control circuit. This optimization is especially necessary when the output buffer is operated with tristate logic, i.e., the output buffer can be placed in a high impedance state where neither the PMOS pull-ups nor the NMOS pull-downs are enabled. High impedance is required, for example, in embodiments in which current flow can be bi-directional. As previously mentioned, the circuit of FIG. 7 can be implemented with two copies of voltage translator 700, one copy translating from the first domain to the second domain, the second copy translating from the second domain to the first domain. Only one of the two copies can be active at a time, yet the two copies share pins on the chip. Whenever an output buffer is not in use, that output buffer must be placed in a high impedance mode. Improper design of the gate control circuit can allow excess shoot-through current and corresponding ground noise if both output devices are enabled for a short period of time. One method of resolving this issue would be for the gate driver to turn ON the output devices slower to minimize the shoot-through current, but this would result in degraded propagation delay through the data path.

Figure 10:
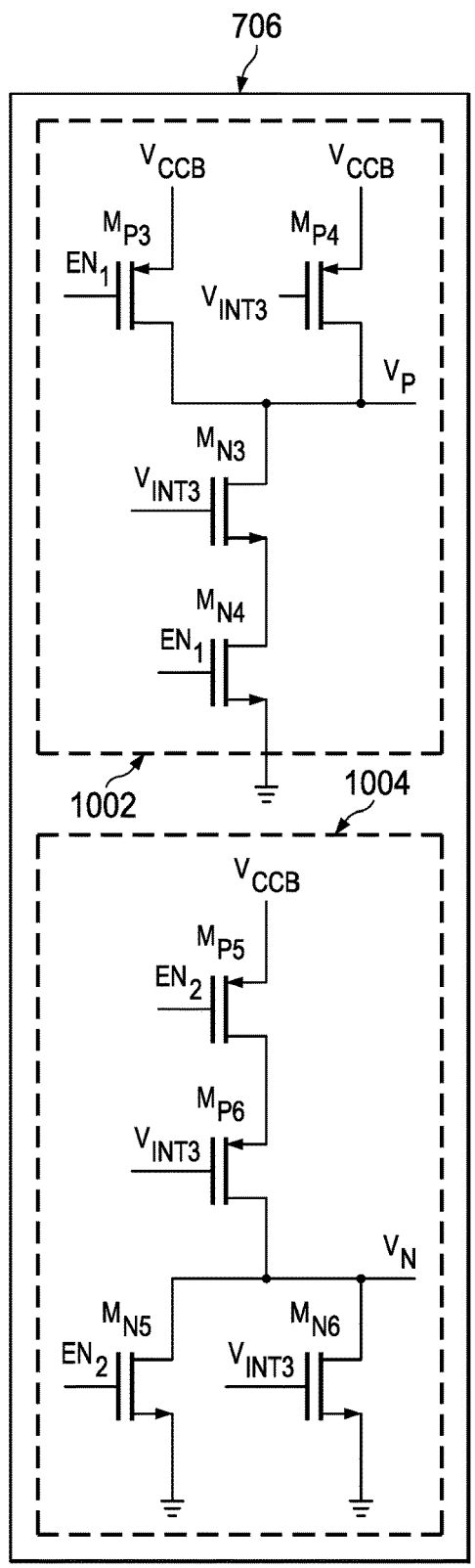
FIG. 10 depicts an embodiment of a NAND/NOR pre-driver according to the prior art.

One existing solution, shown in FIG. 7, uses a NAND-NOR pre-driver 706 for outputs that can be placed in a high impedance state. FIG. 10 is an enlarged reproduction of pre-driver 706. Pre-driver 706 includes two separate circuits: NAND circuit 1002 provides gate control signal $V_P$ and NOR circuit 1004 provides gate control signal $V_N$.

NAND circuit 1002 has two PMOS transistors $M_{P3}$, $M_{P4}$ coupled in parallel between upper rail $V_{CCB}$ and gate control signal $V_P$ and two NMOS transistors $M_{N3}$, $M_{N4}$ coupled in series between gate control signal $V_P$ and the lower rail. Transistors $M_{P3}$ and $M_{N4}$ are each controlled by a first enable signal $EN_1$ and transistors $M_{P4}$ and $M_{N3}$ are each controlled by signal $V_{INT3}$, which is received from the level shifter circuit.

NOR circuit 1004 has two PMOS transistors $M_{P5}$, $M_{P6}$ coupled in series between upper rail $V_{CCB}$ and gate control signal $V_N$ and two NMOS transistors $M_{N5}$, $M_{N6}$ coupled in parallel between gate control signal $V_N$ and the lower rail. Transistors $M_{P5}$ and $M_{N5}$ are each controlled by a second enable signal $EN_2$ and transistors $M_{P6}$ and $M_{N6}$ are each controlled by signal $V_{INT3}$ from the level shifter circuit. In pre-driver 706, signal $V_{INT3}$ provides a level-shifted version of the input signal to input buffer 702 and controls the value of gate control signals $V_P$ and $V_N$ to drive the transistors in output buffer 708. Enable signals $EN_1$ and $EN_2$ operate to ensure that when the output buffer is placed in high impedance mode, $V_P$ is pulled high to turn OFF PMOS transistors $M_{PL1}$ and $M_{PS1}$ in output buffer 100 and $V_N$ is pulled low to turn OFF NMOS transistors $M_{NL1}$, $M_{NS1}$. Enable signals $EN_1$, $EN_2$ also ensure that the transistors in output buffer 100 are turned OFF during power-on procedures.

In adapting pre-driver circuit 706 to operate with an extended range of voltages, the majority of the transistors were each replaced by a low-$V_T$ transistor coupled in parallel with a standard $V_T$ transistor, as explained in the section on parallel $V_T$ architecture. However, due to the additional leakage that low $V_T$ transistors have in relationship to standard $V_T$ transistors (e.g., three orders of magnitude more), it was also considered desirable to eliminate transistors wherever possible to keep the leakage low and the area necessary for the circuit as small as possible.

Figure 3:
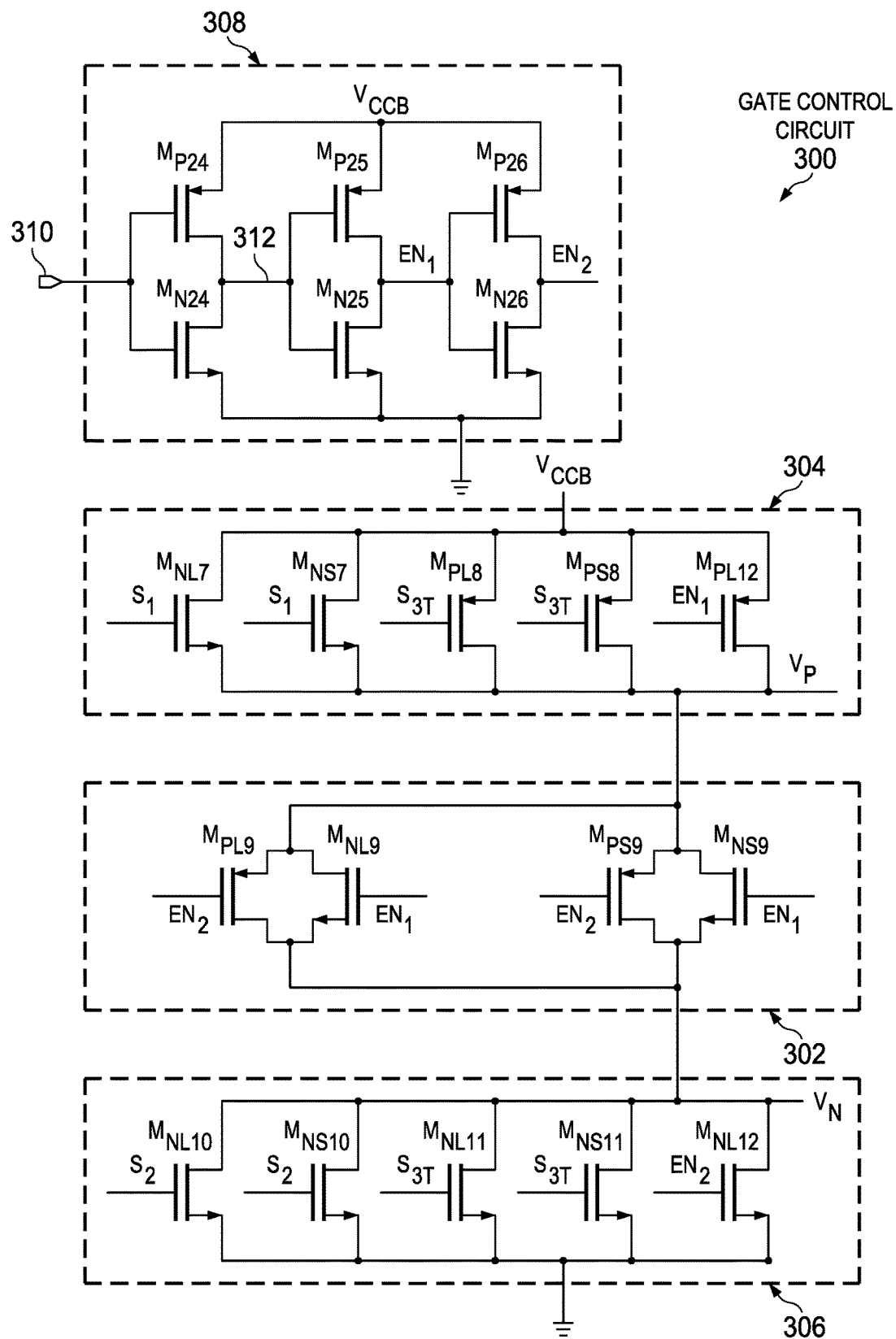
FIG. 3 depicts an implementation of a gate control circuit according to an embodiment of the disclosure.

FIG. 3 depicts a gate control circuit 300 according to an embodiment of the disclosure. Gate control circuit 300 is specifically designed to drive an output buffer that operates with tristate logic that can be placed in a high-impedance state. Gate control circuit 300 includes four sections: a gate isolation switch 302, pull-up circuit 304, pull-down circuit 306 and an enable/disable control circuit 308. Gate isolation switch 302 provides isolation of gate control signal $V_P$ from gate control signal $V_N$ when necessary but allows gate control signals $V_P$ and $V_N$ to share the pull-up circuit 304 and pull-down circuit 306 when the output buffer is enabled. This is in contrast to circuits 1002, 1004 of FIG. 10, where pull-up transistors and pull-down transistors are coupled to control gate control signal $V_P$ and additional pull-up transistors and pull-down transistors are coupled to control gate control signal $V_N$. Enable/disable control circuit 308 provides enable signals $EN_1$, $EN_2$, which ensure that gate control signals $V_P$ and $V_N$ can be placed in high impedance when necessary. Pull-up circuit 304 and pull-down circuit 306 utilize the parallel $V_T$ architecture previously described and provide additional helpers and enable signals as will be explained below.

Enable/disable control circuit 308 includes three inverters, coupled in parallel between upper rail $V_{CCB}$ and the lower rail. Enable/disable control circuit 308 receives an input signal 310 and provides enable signals $EN_1$ and $EN_2$. A first inverter includes PMOS transistor $M_{P24}$ and NMOS transistor $M_{N24}$; this first inverter receives input signal 310 and provides an inverted signal 312. A second inverter includes PMOS transistor $M_{P25}$ and NMOS transistor $M_{N25}$, receives input signal 312 and provides the enable signal $EN_1$. A third inverter includes PMOS transistor $M_{P26}$ and NMOS transistor $M_{N26}$, receives enable signal $EN_1$ and provides enable signal $EN_2$. In one embodiment, the enable/disable control circuit 308 is controlled by the settings applied to pins on a chip containing the disclosed gate control circuit 300. In one embodiment, the value of input signal 310 is controlled by the direction of voltage translation and can also be set by an enable pin.

Gate isolation switch 302 is at the heart of gate control circuit 300 and includes two PMOS transistors $M_{PL9}$, $M_{PS9}$ and two NMOS transistors $M_{NL9}$, $M_{NS9}$ coupled in parallel between gate control signal $V_P$ and gate control signal $V_N$. In accordance with the parallel $V_T$ architecture, transistors $M_{PL9}$ and $M_{NL9}$ are low $V_T$ transistors, which are selected to operate below 1V, while transistors $M_{PS9}$ and $M_{NS9}$ are standard $V_T$ transistors, which are selected to operate above 1V. The two NMOS transistors $M_{NL9}$, $M_{NS9}$ are controlled by a first enable signal $EN_1$ and the two PMOS transistors $M_{PL9}$, $M_{PS9}$ are controlled by a second enable signal $EN_2$. Gate isolation switch 302 connects the gate control signal $V_P$ and gate control signal $V_N$ when the output is enabled and disconnects the output signals when the output buffer is disabled, i.e. in the high impedance state. While gate isolation switch 302 is shown as containing both standard $V_T$ transistors and low $V_T$ transistors, this combination is not necessary in gate isolation switch 302. In another embodiment (not specifically shown) that does not span the wide range of the disclosed embodiment, gate isolation switch 302 includes only a single NMOS transistor controlled by the first enable signal and a single PMOS transistor controlled by the second enable signal. The use of gate isolation switch 302 in place of NAND/NOR gate drivers can reduce the total low $V_T$ transistor width while maintaining consistent drive turn-on.

The output gate pull-up circuit 304 includes five transistors coupled in parallel between the upper rail, $V_{CCB}$, and gate control signal V. PMOS transistors $M_{PL8}$ and $M_{PS8}$ are the main pull-up transistors and are controlled by output control signal $S_{3T}$, which is received from the level shifter circuit and will drive the gate control signal $V_P$ in response to the input signal received by the voltage translator. However, during development of the overall voltage translator, it was necessary to skew the sizes of the PMOS transistors in relationship to the NMOS transistors throughout the voltage translator. Because of this skewed relationship, helper NMOS transistors $M_{NL7}$ and $M_{NS7}$ are provided and are each controlled by input control signal $S_1$, which is received from the input buffer 200. A discussion of the exact manner in which these helper NMOS transistors, $M_{NL7}$, $M_{NS7}$, operate to assist the main PMOS transistors, $M_{PL8}$, $M_{PS8}$ is deferred to the section that discusses the voltage shifter. Using both standard $V_T$ transistors and low $V_T$ transistors provides for optimal propagation delays across the entire voltage range, while the use of the NMOS helper transistors provides a supply boost where necessary. The final transistor in pull-up circuit 304 is PMOS transistor $M_{PL12}$, which is controlled by enable signal $EN_1$. PMOS transistor $M_{PL12}$ can be utilized during power-up of the circuit to pull gate control signal $V_P$ high and turn the PMOS output transistors, $M_{PL1}$, $M_{PL2}$, OFF. This transistor can be implemented either as shown or utilizing parallel low $V_T$ and standard $V_T$ transistors.

In a similar fashion, output gate pull-down circuit 306 includes five transistors coupled in parallel between gate control signal $V_N$ and the lower rail. NMOS transistors $M_{NL11}$ and $M_{NS11}$ are the main pull-down transistors and are also controlled by output control signal $S_{3T}$ from the level shifter circuit. Transistors $M_{NL11}$, $M_{NS11}$ drive the gate control signal $V_N$ in response to the input signal received by the voltage translator. Helper NMOS transistors $M_{NL10}$ and $M_{NS10}$ are provided and are each controlled by input control signal $S_2$, which is also received from the input buffer 200. The use of one pair of NMOS transistors driven according to the first voltage domain and one pair of NMOS transistors driven according to the second voltage domain provides for optimal propagation delays across the entire voltage range. Further discussion of the operation of helper NMOS transistors, $M_{NL107}$ $M_{NS10}$ is again deferred to the section that discusses the voltage shifter. The final transistor in output gate pull-down circuit 306 is NMOS transistor $M_{NL12}$, which is controlled by enable signal $EN_2$. NMOS transistor $M_{NL12}$ can be utilized during power-up of the circuit to pull gate control signal $V_N$ low and turn the NMOS output transistors, $M_{NL1}$, $M_{NL2}$, OFF. As with transistor $M_{PL127}$ transistor $M_{PL12}$ can be implemented either as shown or utilizing parallel low $V_T$ and standard $V_T$ transistors.

When it is desirable to place the output buffer into a high impedance mode, input signal 310 can be utilized to set enable signal $EN_1$ at the lower rail and to set enable signal $EN_2$ at the upper rail. This setting turns ON PMOS transistor $M_{PL12}$ to pull $V_P$ high and turn OFF the PMOS transistors in output buffer 100; this setting also turns ON NMOS transistor $M_{NL12}$ to pull $V_N$ low and turn OFF the NMOS transistors in output buffer 100. At the same time, transistors $M_{PL9}$, $M_{NL9}$, $M_{PS9}$, $M_{NS9}$ of gate isolation switch 302 are all turned OFF. During normal operation, enable signal $EN_1$ is set at the upper rail and enable signal $EN_2$ is set at the lower rail to turn OFF both PMOS transistor $M_{PL12}$ and NMOS transistor $M_{NL12}$, allowing the other transistors in pull-up circuit 304 and pull-down circuit 306 to control the values of $V_P$ and $V_N$. This setting also turns ON the switches in gate isolation switch 302. Although not specifically shown in FIG. 3, enable/disable control circuit 308 can also be implemented using the parallel architecture described earlier.

In contrast to the pre-driver circuit 706, which has been widely used in the past, the disclosed pre-driver circuit only uses a pull-up device for the PMOS gate driver and a pull-down device for the NMOS gate driver along with the connecting transmission gate. The gate control circuit 300 effectively eliminates transistors $M_{N4}$ and $M_{P5}$ from the design, while combining the associated enable signals and additionally utilizing the advantages of parallel $V_T$ architecture and the helper transistors that assist across the wide voltage range. Using gate isolation switch 302, gate control circuit 300 provides a simpler control circuit from a timing perspective.

It should be noted that while the disclosed gate isolation switch 302 was originally designed to operate with a wide range of voltages that called for the use of parallel $V_T$ architecture, gate isolation switch 302 can also be implemented in circuits that do not utilize the parallel architecture. FIG. 3A depicts a gate control circuit 300A according to an embodiment of the disclosure. In this simplified embodiment, gate isolation switch 302A includes a PMOS transistor $M_{P27}$ coupled in parallel with NMOS transistor $M_{N27}$ between gate control signal $V_P$ and gate control signal $V_N$. The gate of NMOS transistor $M_{N27}$ is controlled by enable signal $EN_1$ and the gate of PMOS transistor $M_{P27}$ is controlled by enable signal $EN_2$. Pull-up circuit 304A can be configured with a desired configuration of transistors coupled to both the upper rail and to gate control signal $V_P$. Similarly, pull-down circuit 306A can also be configured with a desired configuration of transistors coupled to both the lower rail and to gate control signal $V_N$. This simplified version of gate isolation circuit 302A can connect pull-up circuit 304A and gate control signal $V_P$ to pull-down circuit 306A and gate control signal $V_N$ when gate control circuit 300A is active, yet effectively close the connection when the output buffer controlled by gate control circuit 300A is placed in high impedance mode.

The disclosed embodiments are advantageous because the gate isolation switch 302 inherently keeps the output in a high impedance state during power-up and provides a natural break-before-make feature due to the transmission gate. That is, when gate control signal $V_P$ goes from a high value to a low value, the charge on gate control signal $V_P$ must discharge through gate isolation switch 302. Before that can occur, gate control signal $V_N$ will first drop, turning OFF NMOS output transistors $M_{NL1}$, $M_{NS1}$. Only then can gate control signal $V_P$ discharge through pull-down circuit 306. This connection simplifies the gate control circuit, minimizes the overall die area and minimizes the static leakage from the gate control circuit. In one embodiment, the use of gate isolation switch 302 provided the following advantages over the prior art NAND/NOR pre-driver configuration: Gate isolation switch 302 is fifty percent smaller, has a 1.3% reduction in total static leakage current, and the propagation delay is 34.5% lower compared to the NAND/NOR circuit.

Level Shifter Boost Circuit

A challenging problem that arises as a result of expanding the voltage range of the voltage translator is designing level shifter 400 with sufficient transient response. As a general design rule, the width of the PMOS transistors is twice the width of the NMOS transistors, i.e., a 2:1 ratio. However, when the level shifter is operating to translate a signal from 0.65V to 3.6V, i.e., the maximum upwards level shift, the NMOS transistors are receiving an ON signal that is barely able to turn the NMOS transistors ON, while the PMOS transistors are receiving a much stronger signal. In order to work properly with this large voltage difference, the PMOS transistor widths must therefore be chosen to be significantly smaller than the NMOS transistor widths. In one embodiment, the resulting ratio between the PMOS and NMOS transistor widths is 1:3, i.e., the PMOS transistor are much smaller than usual. While this extreme skewing of transistor sizes is necessary when the input signal is low and the output signal is high, this skewing causes poor transient response for low-to-high switching when the input signal is higher and closer to the voltage level of the output. The poor transient response in turn makes fast switching difficult to achieve.

One possible solution to the extreme skewing of sizes of the PMOS/NMOS transistors can be to use passive resistors coupled in parallel with the PMOS transistors to pull-up the output signal. However, these devices will contribute additional leakage current to the design when the output is driven low and will take up a significant amount of area since the resistors would necessarily have large resistance values.

FIG. 4 depicts a level shifter 400 that has been implemented according to an embodiment of the disclosure. Of the design shown, level shifting circuit 402 of level shifter 400 is the original level shifter as shown in prior art FIG. 7, although in level shifting circuit 402, all of the previous transistors are replaced by low $V_T$ transistors. Level shifting circuit 402 is made up of two PMOS transistors $M_{PL15}$, $M_{PL16}$ and two NMOS transistors $M_{NL15}$, $M_{NL16}$. PMOS transistor $M_{PL15}$ is coupled in series with NMOS transistor $M_{NL15}$ between upper rail, $V_{CCB}$, and the lower rail and PMOS transistor $M_{PL16}$ is coupled in series with NMOS transistor $M_{NL16}$ between $V_{CCB}$ and the lower rail. The gate of PMOS transistors $M_{PL15}$ is coupled to the drain of PMOS transistor $M_{PL16}$ and the gate of PMOS transistors $M_{PL16}$ is coupled to the drain of PMOS transistor $M_{PL15}$. Finally, the gate of NMOS transistor $M_{NL15}$ is controlled by input control signal $S_2$ and the gate of NMOS transistor $M_{NL16}$ is controlled by input control signal $S_1$; both of input control signals $S_1$ and $S_2$ are created in the first voltage domain. This means that NMOS transistors $M_{NL15}$, $M_{NL16}$ are controlled by signals created in the first voltage domain, while PMOS transistors $M_{PL15}$, $M_{PL16}$ are controlled by signals in the second voltage domain, creating the problem noted above. Notably, only low $V_T$ transistors are used for switching capability over the full voltage range from 0.65V to 3.6V on either supply. The width of low $V_T$ transistors is minimized to keep the leakage current as low as possible.

Rather than providing passive resistors coupled in parallel with the PMOS transistors to pull-up the output signal, level shifter 400 discloses the use of several NMOS transistors coupled in parallel with the PMOS transistors as helper transistors. In the embodiment shown, pull-up circuit 404A includes two NMOS transistors, $M_{NL17}$, $M_{NS17}$, which are each coupled in parallel with PMOS transistor $M_{PL15}$ between upper rail $V_{CCB}$ and output control signal $S_{3T}$. The gates of NMOS transistors $M_{NL17}$, $M_{NS17}$ are controlled by input control signal $S_1$. A second pull-up circuit 404B includes two additional NMOS transistors $M_{NL18}$, $M_{NS18}$, which are each coupled in parallel with PMOS transistor $M_{PL16}$ between upper rail $V_{CCB}$ and output control signal $S_{2T}$ and have their gates controlled by input control signal $S_2$. The size of these helper NMOS transistors $M_{NL17}$, $M_{NS17}$, $M_{NL18}$, $M_{NS18}$, is small compared to the size of NMOS transistors $M_{NL15}$, $M_{NL16}$. In one embodiment, the helper NMOS transistors $M_{NL17}$, $M_{NS17}$, $M_{NL18}$, $M_{NS18}$, have respective widths that are one-fifth to one-fourth the width of NMOS transistors $M_{NL15}$, $M_{NL16}$. Since the NMOS transistors are driven by the input control signals $S_1$, $S_2$, while the PMOS transistors are driven by output control signals $S_{2T}$, $S_{3T}$, the effectiveness of the pull-up circuits 404 scales with the input and output voltage levels. That is, when the voltage of upper rail $V_{CCA}$ is low, pull-up circuits 404 will only be weakly turned on. However, since the response of NMOS transistors $M_{NL15}$, $M_{NL16}$ is weak in this same situation, a strong response from pull-up circuit 404 is not desired. When the voltage on upper rail $V_{CCA}$ is set to be higher and the effect of the skewed sizes of the PMOS transistors $M_{PL17}$, $M_{PL18}$ is very evident, the effect of pull-up circuits 404 is stronger and continues to scale upward as upper rail $V_{CCA}$ is set to higher values. The pull-up circuits 404 help improve the switching time and data rate. A final element of level shifter 400 is a disable switch 406, which in the disclosed embodiment contains a single low threshold voltage NMOS transistor $M_{NL21}$. Disable switch 406 is provided to reduce the dynamic current of the full bitcell by blocking current path of non-switching half bit level shifter. That is, when the output buffer to which the level shifter is coupled is placed in high-impedance mode, the disable switch 406 will turn OFF to keep the level shifter from switching based on the input state. Although not implemented in parallel architecture in the embodiment shown, disable switch 406 could also be implemented in parallel in other embodiments. The width of the low $V_T$ transistor is minimized to keep the leakage current as low as possible.

Figure 5A:
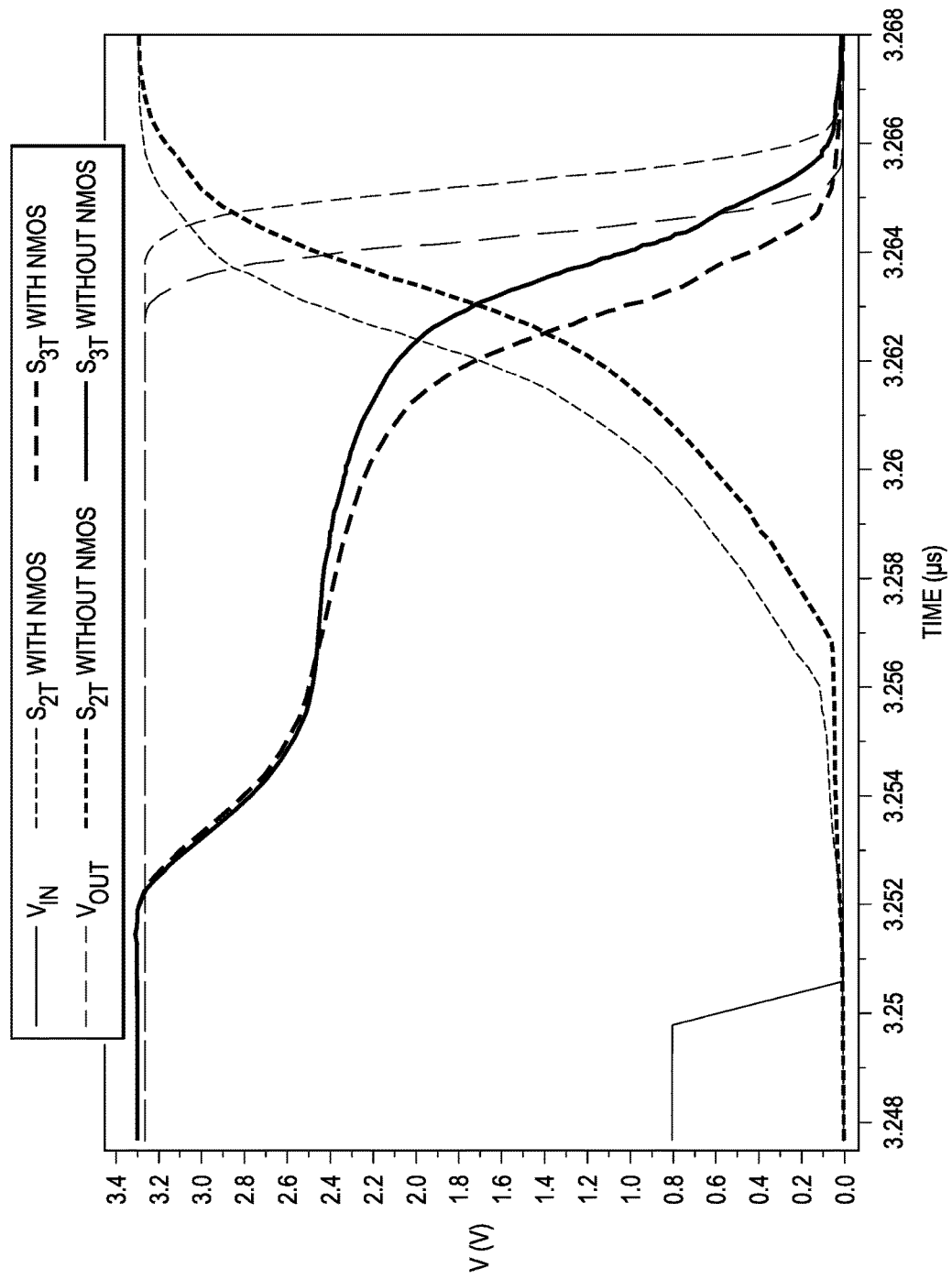
FIG. 5A illustrates the effects of the added helper transistors on output control signals $S_{3T}$ and $S_{2T}$ according to an embodiment of the disclosure.

FIG. 5A illustrates the effects of the added helper transistors on the output control signals $S_{3T}$ and $S_{2T}$ in an implementation of the disclosed level shifter 400. Each of signals $S_{3T}$, $S_{2T}$ is shown both with and without the helper NMOS transistors. It can be seen that use of the NMOS helpers allows output control signal $S_{2T}$ to rise more quickly, thus turning off PMOS transistor $M_{PL16}$ more quickly and allowing output control signal $S_{3T}$ to be pulled down quicker. Level shifter 400 is able to flip faster, so the downstream transistors controlled by output control signal $S_{3T}$ also switch faster. In testing using an input upper rail $V_{CCA}$ equal to 0.8V and an output upper rail $V_{CCB}$ equal to 3.3V using weak process models and 130° C., the use of the pull-up circuits 404 improved propagation delay, $T_{PD}$, from 15 ns to 14 ns. Using the same process conditions for an input upper rail $V_{CCA}$ equal to 1.65 V and an output upper rail $V_{CCB}$ equal to 3.0 V, $T_{PD}$ improved from 3.48 ns to 3.19 ns. This improvement is critical for achieving a data rate of 500 Mbps.

Figure 5B:
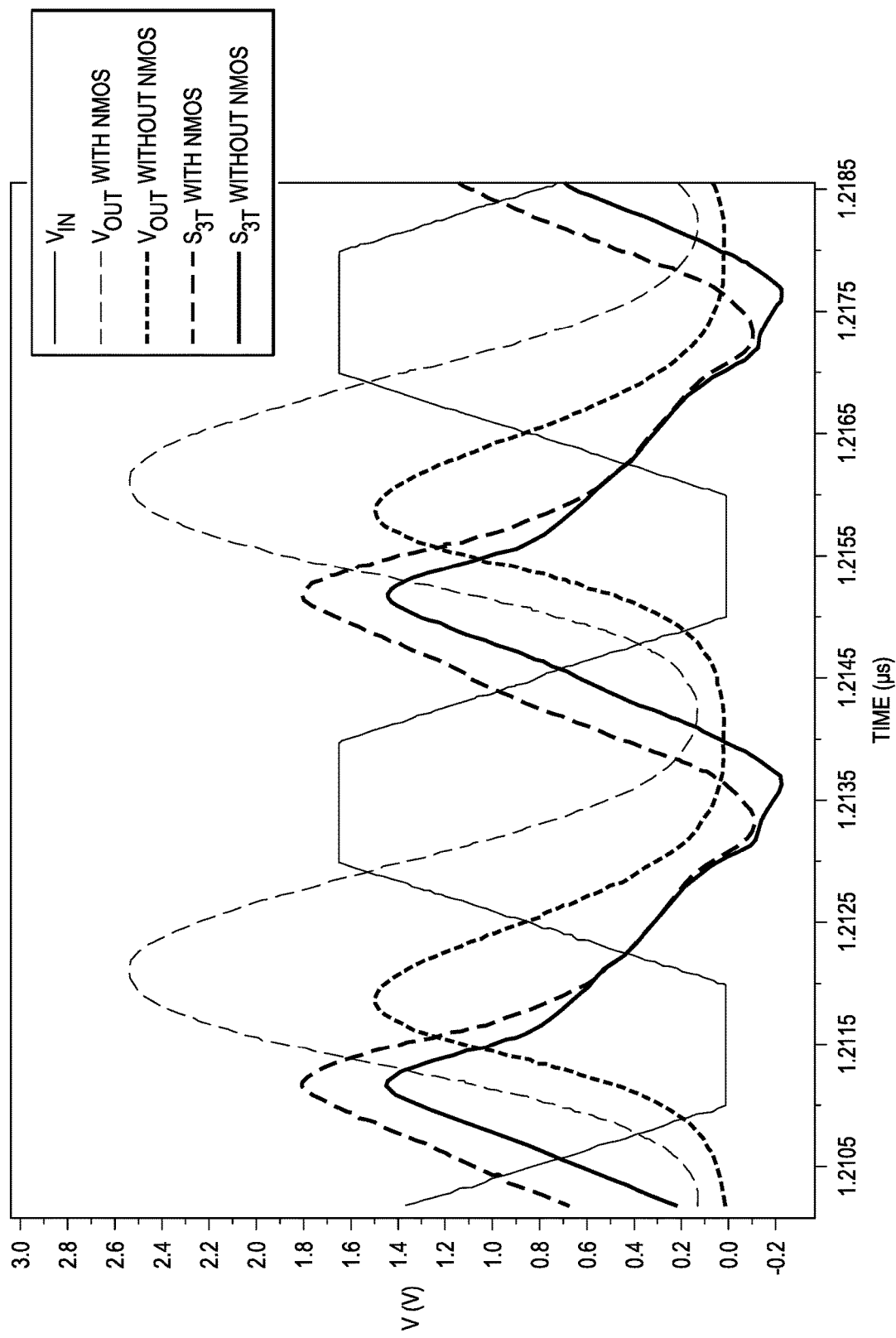
FIG. 5B illustrates the increased amplitude of $V_{OUT}$ as one of the effects of the added helper transistors according to an embodiment of the disclosure.

FIG. 5B is a view of a larger portion of the graph shown in FIG. 5A, but without output control signal $S_{2T}$, in order to illustrate the increased amplitude of $V_{OUT}$ that results from the use of the added helper transistors. It can be seen in FIG. 5B that using the pull-up circuits 404, output control signal $S_{3T}$ swings higher. As an effect of the higher swing of output control signal $S_{3T}$, $V_{OUT}$ also swings higher. As mentioned previously, when upper rail $V_{CCB}$ is 3.0 V, the output high voltage should not drop below 2.3 V. In a test for operation at a data rate of 500 Mbps with $V_{CCA}$=1.65 V, $V_{CCB}$=3.0 V, Weak, 130° C., with no pull-up circuits 404, the high level of $V_{OUT}$ was 1.49 V, which is less than the required high voltage of 2.3 V at this level. In contrast, when pull-up circuits 404 were added to the circuit, the high level of $V_{OUT}$ was 2.54 V, which is greater than the required high voltage of 2.3 V. The addition of helper transistors thus allows the level shifter to provide the necessary voltage levels for proper operation. This capability extends across the range of support input and output voltages.

The disclosed level shifter with NMOS helper transistors is advantageous since it provides a boost to the level shifter output that adjusts with the input and output voltage levels. When the input signal is at a low voltage level compared to the output voltage level, then the NMOS pull-ups provide very little help to the PMOS transistors, which is desirable since the PMOS-to-NMOS ratio is already skewed low. However, when the input signal voltage rail becomes larger, the NMOS pull-ups provide more drive current to pull-up the output signal, which greatly improves the transient response of the level shifter. With the low skewed PMOS-to-NMOS ratio, this extra boost allows the level shifter to provide a good response time across a wide voltage supply range for both input and output levels. In addition, the active pull-ups do not contribute additional leakage current to the design like the previously mentioned use of passive resistors.

Figure 6:
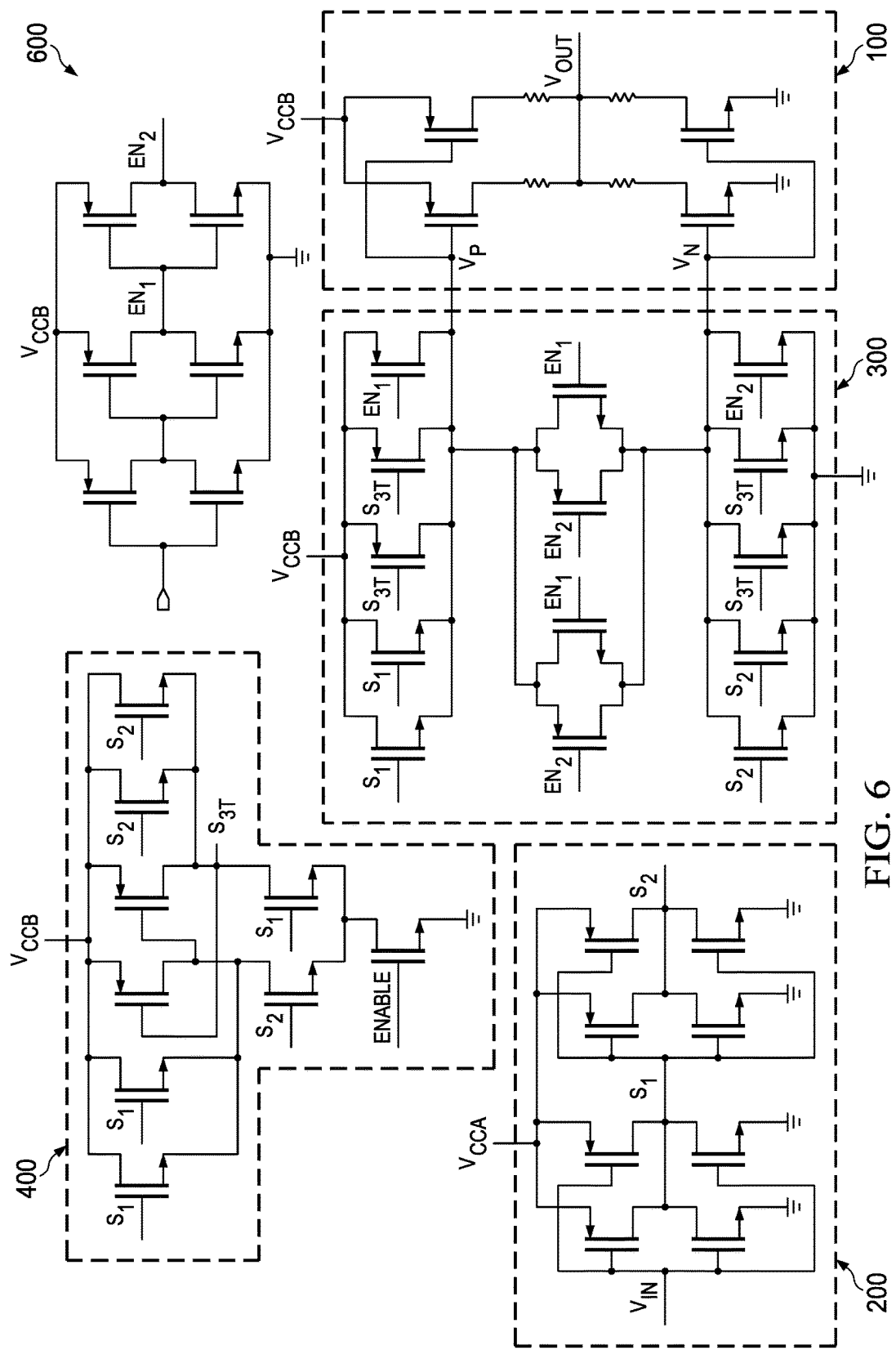
FIG. 6 depicts a schematic of a voltage translator according to an embodiment of the disclosure.

FIG. 6 depicts a voltage translator 600 according to the disclosed embodiments, which is generally a reproduction of the separate circuits discussed above, but is provided to give an overview of the various circuits that have been disclosed. It will be understood that references to NMOS and PMOS transistors in the application are used in a generic sense, i.e., these transistors are referred to as metal oxide silicon devices, even though most gates are actually made of polysilicon and other dielectrics besides oxide can be utilized. Variations to NMOS and PMOS transistors, whether currently known or unknown are intended to be covered by these terms.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A gate control circuit comprising:
   a pull-up circuit coupled between an upper rail and a first gate control signal output;
   a pull-down circuit coupled between a lower rail and a second gate control signal output; and
   a gate isolation switch including a first PMOS transistor coupled in parallel with a first NMOS transistor between the first gate control signal output and the second gate control signal output, the first NMOS transistor being controlled by a first enable signal and the first PMOS transistor being controlled by a second enable signal.

2. The gate control circuit of claim 1 including a tristate output buffer coupled to the first gate control signal output and to the second gate control signal output, when the tristate output buffer is enabled, the first enable signal is high and the second enable signal is low and when the tristate output buffer is in high impedance, the first enable signal is low and the second enable signal is high.

3. The gate control circuit of claim 2 in which the gate isolation switch includes a second PMOS transistor coupled in parallel with a second NMOS transistor between the first gate control signal output and the second gate control signal output, the second NMOS transistor being controlled by the first enable signal and the second PMOS transistor being controlled by the second enable signal, the first PMOS transistor and the first NMOS transistor having a first threshold voltage and the second PMOS transistor and the second NMOS transistor each having a second threshold voltage that is lower than the first threshold voltage.

4. The gate control circuit of claim 3 in which the pull-up circuit includes:
a third PMOS transistor and a fourth PMOS transistor coupled in parallel between the upper rail and the first gate control signal output, and having gates controlled by a first output control signal;
a third NMOS transistor and a fourth NMOS transistor coupled in parallel between the upper rail and the first gate control signal output, and having gates controlled by a second output control signal; and
a fifth PMOS transistor coupled between the upper rail and the first gate control signal output and having a gate controlled by the first enable signal;
the third PMOS transistor and the third NMOS transistor having the first threshold voltage, the fourth PMOS transistor, the fourth NMOS transistor and the fifth PMOS transistor having the second threshold voltage.

5. The gate control circuit of claim 4 in which the pull-down circuit includes:
a fifth NMOS transistor and a sixth NMOS transistor coupled in parallel between the second gate control signal output and the lower rail and having a gate controlled by the first output control signal;
a seventh NMOS transistor and an eighth NMOS transistor coupled in parallel between the second gate control signal output and the lower rail and having a gate controlled by a third output control signal; and
a ninth NMOS transistor coupled between the second gate control signal output and the lower rail and having a gate controlled by the second enable signal;
the fifth NMOS transistor and the seventh NMOS transistor having the first threshold voltage, the sixth NMOS transistor, the eighth NMOS transistor and the seventh ninth NMOS transistor having the second threshold voltage.

6. A voltage translator comprising:
an input buffer having an input signal input, a first input control signal output and a second input control signal output, the input buffer operating in a first voltage domain;
a level shifter having inputs coupled to the first and second input control signal outputs and having an output control signal output;
a gate control circuit having inputs coupled to the first and second input control signal outputs and to the output control signal output and having a first gate control signal output and a second gate control signal output; and
an output buffer having inputs coupled to the first gate control signal output, the second gate control signal output, and an output signal output, the level shifter, the gate control circuit and the output buffer operating in a second voltage domain, the gate control circuit including:
a pull-up circuit coupled between an upper rail and the first gate control signal output;
a pull-down circuit coupled between a lower rail and a the second gate control signal output; and
a gate isolation switch including a first PMOS transistor and a second PMOS transistor coupled in parallel with a first NMOS transistor and a second NMOS transistor between the first gate control signal output and the second gate control signal output, the first and second NMOS transistors being controlled by a first enable signal and the first and second PMOS transistor being controlled by a second enable signal, the first PMOS transistor and the first NMOS transistor having a first threshold voltage, the second PMOS transistor and the second NMOS transistor having a second threshold voltage that is lower than the first threshold voltage.

* * * * *